(12) United States Patent
Schricker et al.

(10) Patent No.: US 8,558,220 B2
(45) Date of Patent: Oct. 15, 2013

(54) MEMORY CELL THAT EMPLOYS A SELECTIVELY FABRICATED CARBON NANO-TUBE REVERSIBLE RESISTANCE-SWITCHING ELEMENT FORMED OVER A BOTTOM CONDUCTOR AND METHODS OF FORMING THE SAME

(75) Inventors: April Schricker, Fremont, CA (US); Mark Clark, Santa Clara, CA (US); Brad Herner, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 1017 days.

(21) Appl. No.: 11/968,156

(22) Filed: Dec. 31, 2007

(65) Prior Publication Data

US 2009/0166609 A1  Jul. 2, 2009

(51) Int. Cl.
*H01L 29/08* (2006.01)

(52) U.S. Cl.
USPC .... 257/40; 438/99; 257/E51.04; 257/E21.613

(58) Field of Classification Search
USPC ................ 257/40, E51.04, E21.613; 438/99; 365/148
See application file for complete search history.

(56) References Cited

U.S. PATENT DOCUMENTS

| | | | |
|---|---|---|---|
| 5,854,102 A | 12/1998 | Gonzalez et al. |
| 5,915,167 A | 6/1999 | Leedy |
| 6,034,882 A | 3/2000 | Johnson et al. |
| 6,706,402 B2 | 3/2004 | Rueckes et al. |
| 6,858,481 B2 | 2/2005 | Krieger et al. |
| 6,946,719 B2 | 9/2005 | Petti et al. |
| 6,952,030 B2 | 10/2005 | Herner |
| 7,149,108 B2 | 12/2006 | Rinerson et al. |
| 7,176,064 B2 | 2/2007 | Herner |
| 7,208,372 B2 | 4/2007 | Hsu et al. |
| 7,286,388 B1 | 10/2007 | Chen et al. |
| 7,385,266 B2 | 6/2008 | Segal et al. |
| 7,405,465 B2 | 7/2008 | Herner |
| 7,575,984 B2 | 8/2009 | Radigan |
| 7,638,383 B2 | 12/2009 | Jin et al. |
| 2004/0160812 A1 * | 8/2004 | Rinerson et al. ............ 365/158 |
| 2004/0166235 A1 | 8/2004 | Fujii et al. |
| 2005/0064167 A1 | 3/2005 | Mao et al. |
| 2005/0195632 A1 | 9/2005 | Rinerson et al. |
| 2006/0214183 A1 | 9/2006 | Gaun et al. |

(Continued)

FOREIGN PATENT DOCUMENTS

| | | |
|---|---|---|
| EP | 1 796 103 | 6/2007 |
| EP | 1 892 722 | 2/2008 |

(Continued)

OTHER PUBLICATIONS

Smith et al., "Polishing TiN for Nanotube Synthesis", Nov. 2001, Proceedings of the 16th Annual Meeting of the American Society for Precision Engineering, pp. 1-4.*

(Continued)

*Primary Examiner* — Julio J Maldonado
*Assistant Examiner* — Sonya D McCall Shepard
(74) *Attorney, Agent, or Firm* — Dugan & Dugan, PC

(57) ABSTRACT

In some aspects, a method of fabricating a memory cell is provided that includes (1) fabricating a first conductor above a substrate; (2) selectively fabricating a carbon nano-tube (CNT) material above the first conductor; (3) fabricating a diode above the CNT material; and (4) fabricating a second conductor above the diode. Numerous other aspects are provided.

51 Claims, 13 Drawing Sheets

(56) References Cited

U.S. PATENT DOCUMENTS

| | | |
|---|---|---|
| 2006/0250836 A1 | 11/2006 | Herner |
| 2006/0268594 A1* | 11/2006 | Toda ............................ 365/100 |
| 2006/0273298 A1 | 12/2006 | Petti |
| 2006/0276056 A1 | 12/2006 | Ward et al. |
| 2007/0018228 A1 | 1/2007 | Sandhu et al. |
| 2007/0037414 A1 | 2/2007 | Yamauchi et al. |
| 2007/0103963 A1 | 5/2007 | Kim et al. |
| 2007/0132049 A1 | 6/2007 | Stipe |
| 2007/0133266 A1 | 6/2007 | Furukawa et al. |
| 2007/0158697 A1 | 7/2007 | Choi et al. |
| 2007/0190722 A1 | 8/2007 | Herner |
| 2007/0238319 A1 | 10/2007 | Jewell-Larsen et al. |
| 2008/0070162 A1 | 3/2008 | Ufert |
| 2008/0142776 A1 | 6/2008 | Seidl |
| 2008/0157257 A1* | 7/2008 | Bertin et al. .................. 257/476 |
| 2008/0165574 A1 | 7/2008 | Kim et al. |
| 2008/0182408 A1 | 7/2008 | Lee et al. |
| 2008/0233744 A1 | 9/2008 | Kaul et al. |
| 2009/0001343 A1 | 1/2009 | Schricker et al. |
| 2009/0001345 A1 | 1/2009 | Schricker et al. |
| 2009/0166610 A1 | 7/2009 | Schricker et al. |
| 2009/0168491 A1 | 7/2009 | Schricker et al. |

FOREIGN PATENT DOCUMENTS

| | | |
|---|---|---|
| JP | 2007-535106 | 11/2007 |
| WO | WO 2006-061599 | 6/2006 |
| WO | WO 2006/102391 A2 | 9/2006 |
| WO | WO 2006-122111 A2 | 11/2006 |
| WO | WO 2006-133949 | 12/2006 |
| WO | WO 2007/053180 | 5/2007 |
| WO | WO 2008-021900 | 2/2008 |
| WO | WO 2008/118486 | 10/2008 |

OTHER PUBLICATIONS

Ago et al., "Workfunction of Purified and Oxidised Carbon Nanotubes," Synthetic Metals, vol. 103, pp. 2494-2495 (1999).*

Subramanian et al., "High-Performance Germanium-Seeded Laterally Crystallized TFTs for Vertical Device Integration," Electron Devices, IEEE Transactions; Publication Date: Sep 1998, vol. 45, Issue 9, pp. 1934-1939.

Uchino et al., "Catalyst Free Low Temperature Direct Growth of Carbon Nanotubes", Jul. 2005, Proceedings of 2005 5th IEEE Conference on Nanotechnology, pp. 1-4.

Li et al., "Bottom-up Approach for Carbon Nanotube Interconnects", Apr. 14, 2003, Applied Physics Letters, vol. 82, No. 15, pp. 2491-2493.

Srivastava et al., "Carbon Nanotube Interconnects: Implications for Performance, Power Dissipation and Thermal Management", 2005, IEEE, pp. 1-4.

Nozaki et al., "Fabrication of Vertically Aligned Single-Walled Carbon Nanotubes in Atmospheric Pressure Non-Thermal Plasma CVD", 2006, Science Direct—Carbon 45 (2007), pp. 364-374.

Shin et al., "Influence of Morphology of Catalyst Thin Film on Vertically Aligned Carbon Nanotube Growth", Science Direct—Journal of Crystal Growth 271 (2004), pp. 81-89.

Abdi et al., "PECVD-Grown Carbon Nanotubes on Silicon Substrates with a Nickel-Seeded Tip-Growth Structure", Science Direct—Materials Science and Engineering C 26 (2006), pp. 1219-1223.

Herner et al., "Polysilicon Memory Switching: Electrothermal-Induced Order", Sep. 2006, IEEE Transactions on Electron Devices, vol. 53, No. 9, pp. 2320-2327.

Herner et al., "Vertical p-i-n. Polysilicon Diode With Antifuse for Stackable Field-Programmable ROM", May 2004, IEEE Electron Device Letters, vol. 25, No. 5, pp. 271-273.

Rao et al., "In Situ-Grown Carbon Nanotube Array with Excellent Field Emission Characteristics", Jun. 19, 2000, Applied Physics Letters, vol. 76, No. 25, pp. 3813-3815.

Meyyappan et al., "Carbon Nanotube Growth by PECVD: a Review", Plasma Sources Sci. Technol. 12 (2003), pp. 205-216.

Choi et al., "Ultrahigh-density Nanotransistors by using Selectively Grown Vertical Carbon Nanotubes", Nov. 26, 2001, Applied Physics Letters, vol. 79, No. 22, pp. 3696-3698.

Malhi et al., "Characteristics and three-dimensional intergration of MOSFETs in small grain LPCVD polysilicon,"IEEE J. Solid State Circuits, vol. SSC-20, pp. 178-201, Feb. 1985.

Son et al., "Electrical Switching in Metallic Carbon Nanotubes", Physical Review Letters, vol. 95, Issue 21, ID 216602, 2005.

International Search Report and Written Opinion of International Application No. PCT/US2008/088585 mailed Jun. 23, 2009.

Schricker, U.S. Appl. No. 12/410,771, filed Mar. 25, 2009.

Schricker, U.S. Appl. No. 12/410,789, filed Mar. 25, 2009.

Chinese Office Action in related Chinese Patent Application No. 200880123671.X issued Sep. 14, 2011.

Schricker et al., U.S. Appl. No. 13/235,409, filed Sep. 18, 2011.

Jang, J.E. et al. "Nanoelectromechanical switches with vertically aligned carbon nanotubes", Applied Physics Letters, vol. 87, (2005) pp. 163114-1-163114-3.

Supplementary European Search Report of counterpart EP Application No. 08869246.2 dated Oct. 17, 2011.

Jan. 20, 2012 Response to Sep. 14, 2011 Office Action in Chinese Patent Application No. 200880123671.X.

May 8, 2012 Response to Nov. 3, 2011 Office Action in EP Application No. 08869246.2.

Communication Pursuant to Rules 70(2) and 70a (2) EPC in counterpart EP Application No. 08869246.2 Nov. 3, 2011.

May 8, 2012 Response to Nov. 3, 2011 Communication Pursuant to Rules 70(2) and 70a (2) EPC in counterpart EP Application No. 08869246.2.

Communication Pursuant to Article 94(3) EPC in counterpart EP Application No. 08869246.2 dated Feb. 5, 2013.

Jun. 10, 2013 Response to Feb. 5, 2013 Communication Pursuant to Article 94(3) EPC in counterpart EP Application No. 08869246.2.

Office Action of related Japanese Patent Application Serial No. 2010-540946 dated Aug. 6, 2013.

* cited by examiner

MEMORY CELL THAT EMPLOYS A SELECTIVELY FABRICATED CARBON NANO-TUBE REVERSIBLE RESISTANCE-SWITCHING ELEMENT FORMED OVER A BOTTOM CONDUCTOR AND METHODS OF FORMING THE SAME

CROSS REFERENCE TO RELATED APPLICATIONS

The present application is related to the following patent applications which are hereby incorporated by reference herein in their entirety for all purposes:

U.S. patent application Ser. No. 13/235,409, filed on even date herewith and titled "MEMORY CELL THAT EMPLOYS A SELECTIVELY FABRICATED CARBON NANO-TUBE REVERSIBLE RESISTANCE-SWITCHING ELEMENT AND METHODS OF FORMING THE SAME".

U.S. patent application Ser. No. 11/968,159, filed on even date herewith and titled "MEMORY CELL WITH PLANARIZED CARBON NANOTUBE LAYER AND METHODS OF FORMING THE SAME".

FIELD OF THE INVENTION

The present invention relates to non-volatile memories and more particularly to a memory cell that employs a selectively fabricated carbon nano-tube (CNT) reversible resistance-switching element formed over a bottom conductor and methods of forming the same.

BACKGROUND OF THE INVENTION

Non-volatile memories formed from reversible resistance-switching elements are known. For example, U.S. patent application Ser. No. 11/125,939, filed May 9, 2005 and titled "REWRITEABLE MEMORY CELL COMPRISING A DIODE AND A RESISTANCE-SWITCHING MATERIAL" (hereinafter "the '939 Application"), which is hereby incorporated by reference herein in its entirety for all purposes, describes a rewriteable non-volatile memory cell that includes a diode coupled in series with a reversible resistivity-switching material such as a metal oxide or metal nitride.

However, fabricating memory devices from rewriteable resistivity-switching materials is technically challenging; and improved methods of forming memory devices that employ reversible resistivity-switching materials are desirable.

SUMMARY OF THE INVENTION

In a first aspect of the invention, a method of fabricating a memory cell is provided that includes (1) fabricating a first conductor above a substrate; (2) selectively fabricating a carbon nano-tube (CNT) material above the first conductor; (3) fabricating a diode above the CNT material; and (4) fabricating a second conductor above the diode.

In a second aspect of the invention, a method of fabricating a memory cell is provided that includes (1) fabricating a first conductor above a substrate; (2) fabricating a reversible resistance-switching element above the first conductor by selectively fabricating carbon nano-tube (CNT) material above the first conductor; (3) fabricating a vertical polycrystalline diode above the reversible resistance-switching element; and (4) fabricating a second conductor above the vertical polycrystalline diode.

In a third aspect of the invention, a memory cell is provided that includes (1) a first conductor; (2) a reversible resistance-switching element including carbon nano-tube (CNT) material selectively fabricated above the first conductor; (3) a diode formed above the reversible resistance-switching element; and (4) a second conductor formed above the diode.

In a fourth aspect of the invention, a plurality of nonvolatile memory cells are provided that includes (1) a first plurality of substantially parallel, substantially coplanar conductors extending in a first direction; (2) a plurality of diodes; (3) a plurality of reversible resistance-switching elements; and (4) a second plurality of substantially parallel, substantially coplanar conductors extending in a second direction different from the first direction. In each memory cell, one of the diodes is formed above one of the reversible resistance-switching elements, disposed between one of the first conductors and one of the second conductors; and each reversible resistance-switching element includes selectively fabricated carbon nano-tube (CNT) material formed above one of the first conductors.

In a fifth aspect of the invention, a monolithic three dimensional memory array is provided that includes a first memory level formed above a substrate. The first memory level includes a plurality of memory cells, and each memory cell of the first memory level includes (1) a first conductor; (2) a reversible resistance-switching element including carbon nano-tube (CNT) material selectively fabricated above the first conductor; (3) a diode formed above the reversible resistance-switching element; and (4) a second conductor formed above the diode. At least a second memory level is monolithically formed above the first memory level. Numerous other aspects are provided.

Other features and aspects of the present invention will become more fully apparent from the following detailed description, the appended claims and the accompanying drawings.

DETAILED DESCRIPTION

Figure 1:
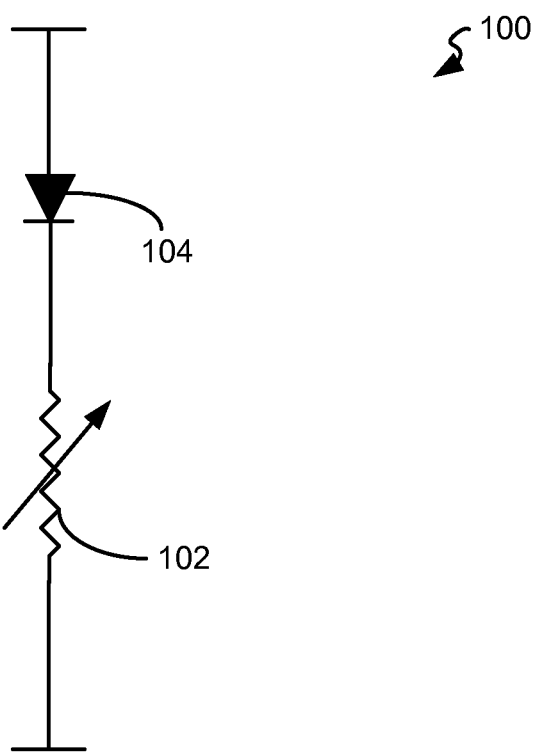
FIG. 1 is a schematic illustration of an exemplary memory cell provided in accordance with the present invention.

Some carbon nano-tube (CNT) materials have been shown to exhibit reversible resistivity-switching properties that may be suitable for use in non-volatile memories. However, deposited or grown CNT material typically has a rough surface topography, with pronounced thickness variations, such as numerous peaks and valleys. These thickness variations make CNT materials difficult to etch without excessive etching of the underlying substrate, increasing fabrication costs and complexity associated with their use in integrated circuits.

In accordance with the present invention, difficult-to-etch, CNT rewriteable resistivity-switching materials may be used within a memory cell without being etched. For example, in at least one embodiment, a memory cell is provided that includes a CNT reversible resistivity-switching material formed by (1) fabricating a first (bottom) conductor above a substrate; (2) depositing a CNT seeding layer above the first conductor; (3) selectively fabricating CNT material on the CNT seeding layer; (4) fabricating a diode above the CNT material; and (5) fabricating a second conductor above the diode.

The CNT seeding layer may be a layer that facilitates CNT formation, such as a surface roughened and/or conducting layer. Selective formation of CNT material on the CNT seeding layer can eliminate or minimize the need to etch the CNT material.

Exemplary CNT seeding layers include titanium nitride, tantalum nitride, nickel, cobalt, iron or the like. In some embodiments, a titanium or tantalum nitride layer may be surface roughened for use as a CNT seeding layer. Such surface roughened titanium or tantalum nitride may itself serve as a CNT seeding layer. In other embodiments, the surface roughened titanium or tantalum nitride layer may be coated with an additional conducting layer to facilitate CNT material formation. Such a conducting layer may be patterned and etched with the titanium or tantalum nitride layer, or selectively deposited on the titanium or tantalum nitride layer after the titanium or tantalum nitride layer is patterned and etched. Exemplary conducting layers include nickel, cobalt, iron, etc.

As used herein, CNT material refers to material that includes one or more single and/or multi-wall CNTs. In some embodiments, the individual tubes of the CNT material may be vertically aligned. Vertically aligned CNTs allow vertical current flow with little or no lateral conduction. In some embodiments, the individual tubes of the CNT material may be fabricated so as to be substantially vertically aligned to reduce or prevent the formation of lateral or bridging conduction paths between adjacent memory cells. This vertical alignment reduces and/or prevents the state of a memory cell from being influenced or "disturbed" by the state and/or programming of adjacent memory cells. Note that individual tube isolation may or may not extend over the entire thickness of the CNT material. For example, during the initial growth phase, some or most of the individual tubes may be vertically aligned and separated. However, as the individual tubes increase in length vertically, portions of the tubes may come in contact with one another, and even become entangled or entwined. Exemplary techniques for forming CNT materials are described below.

Exemplary Inventive Memory Cell

FIG. 1 is a schematic illustration of an exemplary memory cell 100 provided in accordance with the present invention. The memory cell 100 includes a reversible resistance-switching element 102 coupled to a diode 104 and positioned below the diode 104.

The reversible resistance-switching element 102 includes material (not separately shown) having a resistivity that may be reversibly switched between two or more states. For example, the reversible resistivity-switching material of the element 102 may be in an initial, low-resistivity state upon fabrication. Upon application of a first voltage and/or current, the material is switchable to a high-resistivity state. Application of a second voltage and/or current may return the reversible resistivity-switching material to a low-resistivity state. Alternatively, the reversible resistance-switching element 102 may be in an initial, high-resistance state upon fabrication that is reversibly switchable to a low-resistance state upon application of the appropriate voltage(s) and/or current (s). When used in a memory cell, one resistance state may represent a binary "0" while another resistance state may represent a binary "1", although more than two data/resistance states may be used. Numerous reversible resistivity-switching materials and operation of memory cells employing reversible resistance-switching elements are described, for example, the '939 Application, previously incorporated.

In at least one embodiment of the invention, the reversible resistance-switching element 102 is formed using a selectively deposited or grown CNT material. As will be described further below, use of a selectively formed CNT material eliminates the need to etch the CNT material. Fabrication of the reversible resistance-switching element 102 thereby is simplified.

The diode 104 may include any diode that exhibits non-ohmic conduction by selectively limiting the voltage across and/or the current flow through the reversible resistance-switching element 102. In this manner, the memory cell 100 may be used as part of a two or three dimensional memory array and data may be written to and/or read from the memory cell 100 without affecting the state of other memory cells in the array.

Exemplary embodiments of the memory cell 100, the reversible resistance-switching element 102 and the diode 104 are described below with reference to FIGS. 2A-5C.

First Exemplary Embodiment of a Memory Cell

Figure 2A:
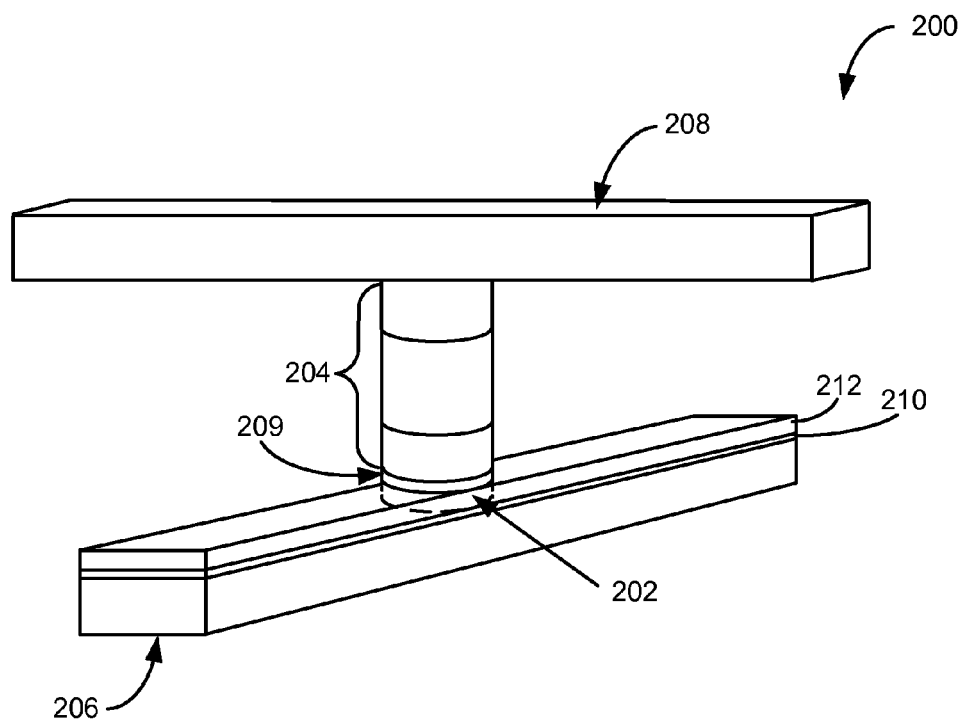
FIG. 2A is a simplified perspective view of a first embodiment of a memory cell provided in accordance with the present invention.

FIG. 2A is a simplified perspective view of a first embodiment of a memory cell 200 provided in accordance with the present invention. With reference to FIG. 2A, the memory cell 200 includes a reversible resistance-switching element 202 (shown in phantom) coupled in series with a diode 204 between a first conductor 206 and a second conductor 208. In some embodiments, a barrier layer 209 such as titanium nitride, tantalum nitride, tungsten nitride, etc., may be provided between the reversible resistance-switching element 202 and the diode 204.

As will be described further below, the reversible resistance-switching element 202 is selectively formed so as to simplify fabrication of the memory cell 200. In at least one embodiment, the reversible resistance-switching element 202 includes at least a portion of a CNT material formed on a CNT seeding layer such as titanium nitride, tantalum nitride, nickel, cobalt, iron or the like. For example, a titanium or tantalum nitride CNT seeding layer 210 may be deposited on the first conductor 206, patterned and etched (e.g., with the first conductor 206). In some embodiments the CNT seeding layer 210 may be surface roughened, such as by chemical mechanical polishing (CMP). In other embodiments, a surface roughened or smooth titanium nitride, tantalum nitride or similar layer may be coated with a metal catalyst layer (not separately shown) such as nickel, cobalt, iron, etc., to form the CNT seeding layer 210. In still other embodiments, the CNT seeding layer 210 may simply be a metal catalyst layer such as nickel, cobalt, iron or the like that promotes CNT formation. In either case, a CNT fabrication process is performed to selectively grow and/or deposit CNT material 212 over the CNT seeding layer 210. At least a portion of this CNT material 212 serves as the reversible resistance-switching element 202. Any suitable method may be used to form CNT material 212 such as chemical vapor deposition (CVD), plasma-enhanced CVD, laser vaporization, electric arc discharge or the like.

In the embodiment of FIG. 2A, a titanium nitride or similar CNT seeding layer 210 is formed over the first conductor 206 and the exposed upper surface of the CNT seeding layer 210 is roughened by CMP or another similar process. The CNT seeding layer 210 then is patterned and etched with the first conductor 206. Thereafter, CNT material 212 is selectively formed over the CNT seeding layer 210. A portion of the CNT material 212 that vertically overlaps and/or aligns with the diode 204 may serve as the reversible resistance-switching element 202 between the diode 204 and the first conductor 206 of the memory cell 200. In some embodiments, only a portion, such as one or more CNTs, of the reversible resistance-switching element 202 may switch and/or be switchable. Additional details for the reversible resistance-switching element 202 are described below with reference to FIGS. 3A-C.

The diode 204 may include any suitable diode such as a vertical polycrystalline p-n or p-i-n diode, whether upward pointing with an n-region above a p-region of the diode or downward pointing with a p-region above an n-region of the diode. Exemplary embodiments of the diode 204 are described below with reference to FIG. 3A.

The first and/or second conductor 206, 208 may include any suitable conductive material such as tungsten, any appropriate metal, heavily doped semiconductor material, a conductive silicide, a conductive silicide-germanide, a conductive germanide, or the like. In the embodiment of FIG. 2A, the first and second conductors 206, 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first and/or second conductors 206, 208 to improve device performance and/or aid in device fabrication.

Figure 2B:
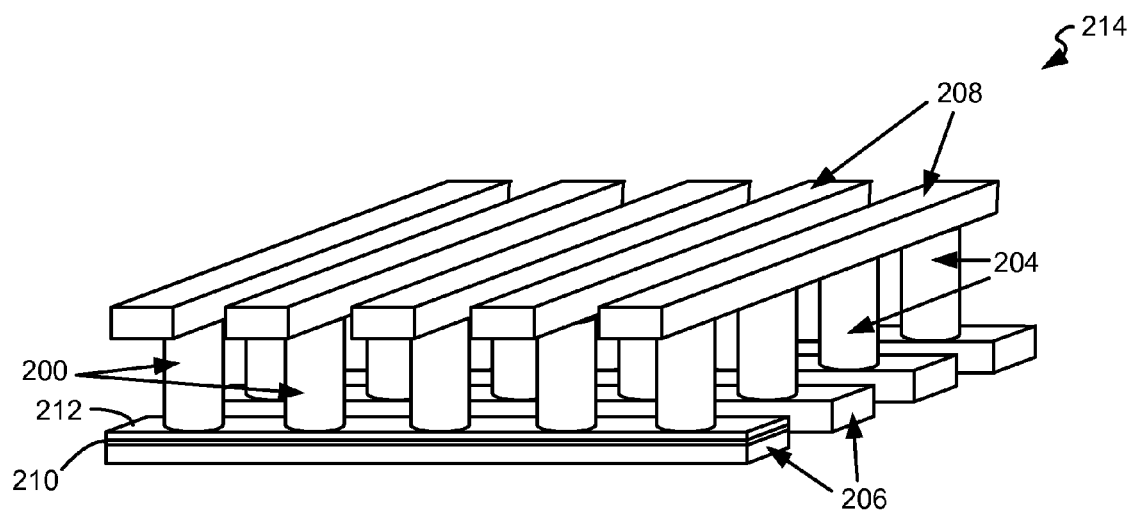
FIG. 2B is a simplified perspective view of a portion of a first memory level formed from a plurality of the memory cells of FIG. 2A.

FIG. 2B is a simplified perspective view of a portion of a first memory level 214 formed from a plurality of the memory cells 200 of FIG. 2A. For simplicity, the CNT seeding layer 210 and CNT material 212 are only shown on one of the bottom conductors 206. The memory array 214 is a "cross-point" array including a plurality of bit lines (second conductors 208) and word lines (first conductors 206) to which multiple memory cells are coupled (as shown). Other memory array configurations may be used, as may multiple levels of memory. Because multiple memory cells are coupled to the CNT material 212 formed on each conductor 206, in one or more embodiments, the individual tubes of the CNT material 212 are preferably substantially vertically aligned to reduce lateral conduction or bridging between memory cells through the CNT material 212. Note that individual tube isolation may or may not extend over the entire thickness of the CNT material. For example, during the initial growth phase, some or most of the individual tubes may be vertically aligned and separated. However, as the individual tubes increase in length vertically, portions of the tubes may come in contact with one another, and even become entangled or entwined.

Figure 2C:
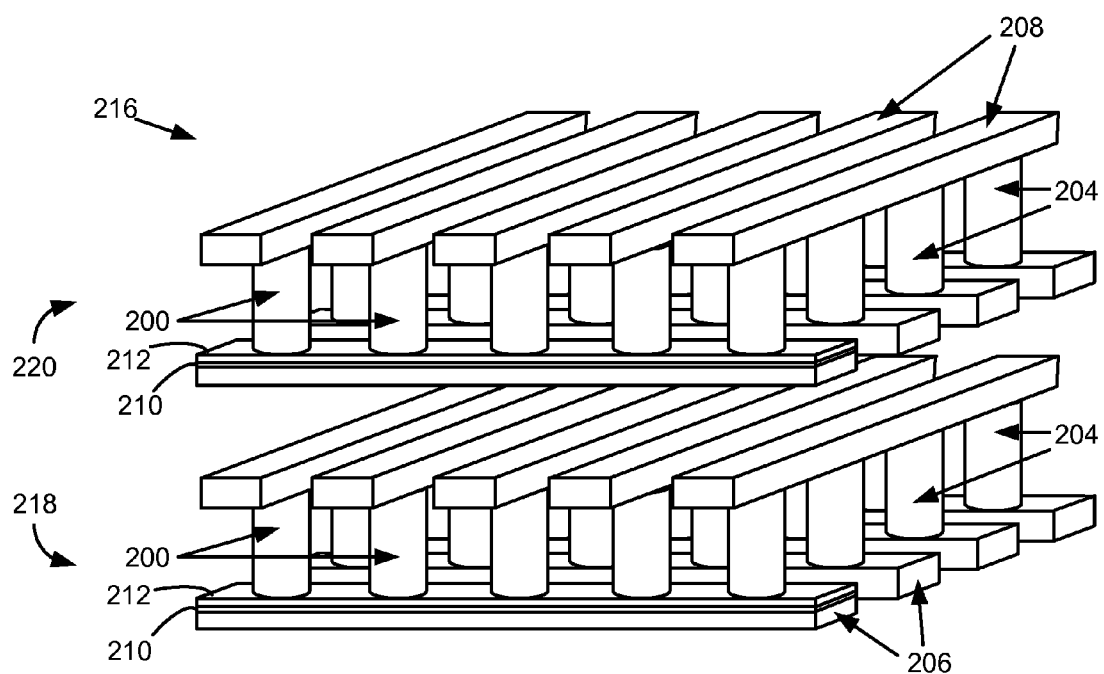
FIG. 2C is a simplified perspective view of a portion of a first exemplary three dimensional memory array provided in accordance with the present invention.

FIG. 2C is a simplified perspective view of a portion of a monolithic three dimensional array 216 that includes a first memory level 218 positioned below a second memory level 220. In the embodiment of FIG. 2C, each memory level 218, 220 includes a plurality of memory cells 200 in a cross-point array. It will be understood that one or more additional layers (e.g., an interlevel dielectric) may be present between the first and second memory levels 218 and 220, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diodes fabrication.

Figure 2D:
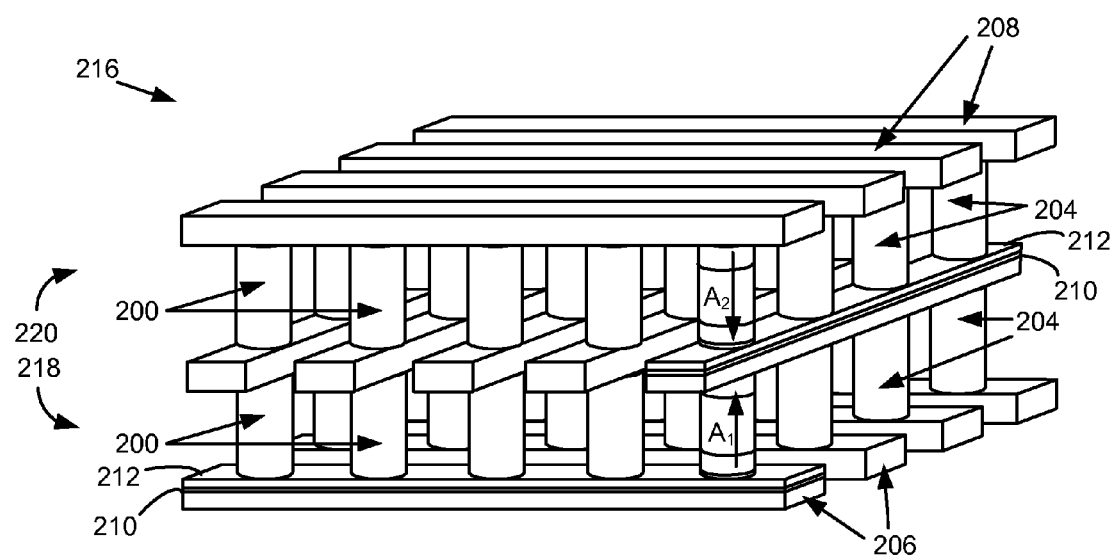
FIG. 2D is a simplified perspective view of a portion of a second exemplary three dimensional memory array provided in accordance with the present invention.

In some embodiments, the memory levels may be formed, as described, for example, in U.S. Pat. No. 6,952,030, "High-density three-dimensional memory cell" which is hereby incorporated by reference herein in its entirety for all purposes. For instance, the upper conductors of a first memory level may be used as the lower conductors of a second memory level that is positioned above the first memory level as shown in FIG. 2D. In such embodiments, the diodes on adjacent memory levels preferably point in opposite directions as described in U.S. patent application Ser. No. 11/692, 151, filed Mar. 27, 2007 and titled "LARGE ARRAY OF UPWARD POINTING P-I-N DIODES HAVING LARGE AND UNIFORM CURRENT" (hereinafter "the '151 Application"), which is hereby incorporated by reference herein in its entirety for all purposes. For example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

Figure 3A:
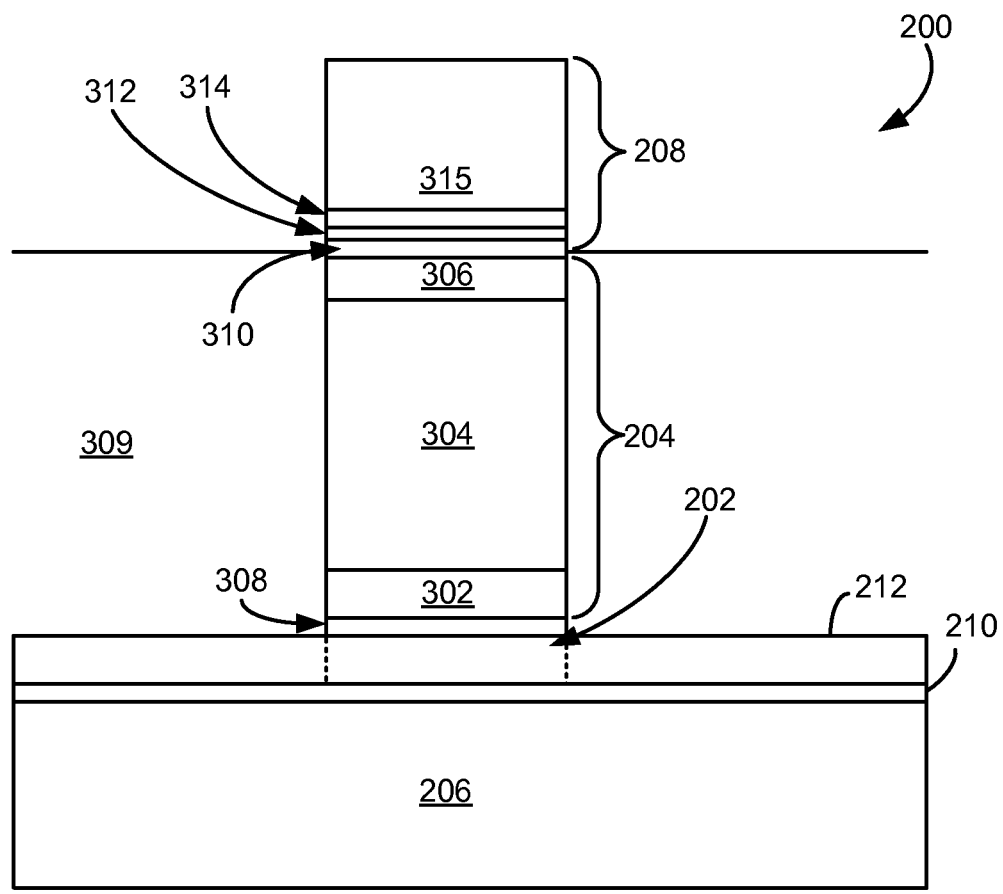
FIG. 3A is a cross-sectional view of a first exemplary embodiment of the memory cell of FIG. 2A.

FIG. 3A is a cross-sectional view of an exemplary embodiment of the memory cell 200 of FIG. 2A. With reference to FIG. 3A, the memory cell 200 includes the reversible resistance-switching element 202, the diode 204 and the first and second conductors 206, 208. The reversible resistance-switching element 202 may be a portion of the CNT material 212 that vertically overlies and/or overlaps with the diode 204.

In the embodiment of FIG. 3A, the reversible resistance-switching element 202 is formed by a selective CNT formation process on a CNT seeding layer 210 formed over the bottom conductor 206. In some embodiments, the CNT seeding layer 210 may be a single layer of roughened metal nitride, such as surface roughened titanium or tantalum nitride, a single layer of a metal catalyst such as nickel, cobalt, iron, etc., or a multi-layer structure formed from a smooth or surface roughened metal nitride coated with a metal catalyst. For example, the CNT seeding layer 210 may be a titanium or tantalum nitride layer formed on and patterned and etched with the first conductor 206. In some embodiments, following patterning and etching of the CNT seeding layer 210, a metal catalyst layer such as nickel, cobalt, iron, etc., may be selectively deposited over the CNT seeding layer to assist in CNT formation.

In other embodiments, the CNT seeding layer 210 may be formed after the first conductor 206 is patterned and etched. For example, the CNT seeding layer 210 may be a metal catalyst layer such as nickel, cobalt, iron, etc., selectively deposited on the patterned and etched first conductor 206. In either case, CNT material 212 is selectively formed only over the CNT seeding layer 210. In this manner, at most, only the CNT seeding layer 210 is etched, such as during the pattern and etch step(s) for the first conductor 206.

In embodiments in which the CNT seeding layer 210 includes titanium nitride, tantalum nitride or a similar material, a CMP or dielectric etchback step may be employed to roughen the surface of the CNT seeding layer 210 prior to patterning and etching of the CNT seeding layer 210 (and first conductor 206). A roughened, titanium nitride, tantalum nitride or similar surface may be employed as a seeding layer for CNT fabrication. For example, roughened titanium nitride has been shown to facilitate formation of vertically aligned CNTs as described by Smith et al., "Polishing TiN for Nanotube Synthesis", Proceedings of the 16$^{th}$ Annual Meeting of the American Society for Precision Engineering, Nov. 10-15, 2001. (See also Rao et al., "In situ-grown carbon nanotube array with excellent field emission characteristics", Appl. Phys. Lett., Vol. 76, No. 25, June 19 200, pp. 3813-3815.)

As an example, the CNT seeding layer 210 may be about 1000 to about 5000 angstroms of a metal nitride such as titanium or tantalum nitride with an arithmetic average surface roughness Ra of about 850 to about 4000 angstroms, and more preferably about 4000 angstroms. In some embodiments, about 1 to about 200 angstroms, and more preferably about 20 angstroms or less, of a metal catalyst layer such as nickel, cobalt, iron, etc., may be deposited onto the surface roughened metal nitride layer prior to CNT formation. In yet other embodiments, the CNT seeding layer 210 may include about 20 to about 500 angstroms of non-roughened or smooth titanium, tantalum or similar metal nitride coated with about 1 to about 200 angstroms, and more preferably about 20 angstroms or less, of a metal catalyst layer such as nickel, cobalt, iron, etc. The nickel, cobalt, iron or other metal catalyst layer in any embodiment may be a continuous or non-continuous film.

In some embodiments, the metal catalyst layer may be formed using an arc plasma gun (APG) method in which an arc plasma gun pulses a lightening bolt onto a metal target so as to shower a substrate with small metal particles (e.g., about 3 nanometers in size). An APG method may provide a very controllable seed density (e.g., as the substrate is not generally heated during deposition and the small metal particles have little mobility).

Other materials, thicknesses and surface roughnesses may be used. Following formation of the CNT seeding layer 210, the CNT seeding layer 210 and/or first conductor 206 may be patterned and etched.

After the CNT seeding layer 210 is defined, a CNT fabrication process is performed to selectively grow and/or deposit CNT material 212 on the CNT seeding layer 210. At least a portion of this CNT material 212 serves as the reversible resistance-switching element 202 (as shown in phantom in FIG. 3A). Any suitable method may be used to form CNT material on the CNT seeding layer 210. For example, CVD, plasma-enhanced CVD, laser vaporization, electric arc discharge or the like may be employed.

In one exemplary embodiment, CNTs may be formed on a TiN seeding layer by CVD at a temperature of about 675 to 700° C. in xylene, argon, hydrogen and/or ferrocene at a flow rate of about 100 sccm for about 30 minutes. Other temperatures, gases, flow rates and/or growth times may be used.

In another exemplary embodiment, CNTs may be formed on a nickel catalyst layer by CVD at a temperature of about 650° C. in about 20% $C_2H_4$ and 80% argon at a pressure of about 5.5 Torr for about 20 minutes. Other temperatures, gases, ratios, pressures and/or growth times may be used.

In yet another embodiment, CNTs may be formed on a metal catalyst layer such as nickel, cobalt, iron, etc., using plasma enhanced CVD at a temperature of about 600 to 900° C. in about 20% methane, ethylene, acetylene or another hydrocarbon diluted with about 80% argon, hydrogen and/or ammonia using an RF power of about 100-200 Watts for about 8-30 minutes. Other temperatures, gases, ratios, powers and/or growth times may be used.

As stated, CNT material 212 forms only over the CNT seeding layer 210. In some embodiments, the CNT material 212 may have a thickness of about 1 nanometer to about 1 micron (and even tens of microns), and more preferably about 10 to about 20 nanometers, although other CNT material thicknesses may be used. The density of individual tubes in the CNT material 212 may be, for example, about $6.6 \times 10^3$ to about $1 \times 10^6$ CNTs/micron$^2$, and more preferably at least about $6.6 \times 10^4$ CNTs/micron$^2$, although other densities may be used. For example, assuming the diode 204 has a width of about 45 nanometers, in some embodiments, it is preferred to have at least about 10 CNTs, and more preferably at least about 100 CNTs, under the diode 204 (although fewer CNTs, such as 1, 2, 3, 4, 5, etc., or more CNTs, such as more than 100, may be employed).

To improve the reversible resistivity-switching characteristics of the CNT material 212, in some embodiments it may be preferable that at least about 50%, and more preferably at least about ⅔, of the carbon nano-tubes of the CNT material 212 are semiconducting. As multiple wall CNTs are generally metallic while single wall CNTs may be metallic or semiconducting, in one or more embodiments, it may be preferable for the CNT material 212 to include primarily semiconducting single wall CNTs. In other embodiments, fewer than 50% of the CNTs of the CNT material 212 may be semiconducting.

Vertically aligned CNTs allow vertical current flow with little or no lateral conduction. To reduce or prevent the formation of lateral or bridging conduction paths between adjacent memory cells (not shown) fabricated on a memory level that includes the memory cell 200, in some embodiments, the individual tubes of the CNT material 212 may be fabricated so as to be substantially vertically aligned (e.g., thereby reducing and/or preventing the state of a memory cell from being influenced or "disturbed" by the state and/or programming of adjacent memory cells). Note that individual tube isolation may or may not extend over the entire thickness of the CNT material 212. For example, during the initial growth phase, some or most of the individual tubes may be vertical aligned (e.g., not touching). However, as the individual tubes increase in length vertically, portions of the tubes may come in contact with one another, and even become entangled or entwined.

In some embodiments, defects may be intentionally created in the CNT material 212 to improve or otherwise tune the reversible resistivity-switching characteristics of the CNT material 212. For example, after the CNT material 212 has been formed on the CNT seeding layer 210, argon, $O_2$ or another species may be implanted into the CNT material 212 to create defects in the CNT material 212. In a second example, the CNT material 212 may be subjected or exposed to an argon or $O_2$ plasma (biased or chemical) to intentionally create defects in the CNT material 212.

As will be described further below with reference to FIGS. 4A-F, following formation of the CNT material 212/reversible resistance-switching element 202, dielectric material is deposited on top of and around the CNT material 212 and first conductor 206. In some embodiments, the dielectric material may be deposited using chemical vapor deposition (CVD), high density plasma (HDP) deposition, arc plasma assisted deposition, spin-coating deposition or the like. This dielectric material isolates the CNT material 212 and first conductor 206 from other similar CNT material regions and first conductors of other memory cells (not shown) fabricated on a memory level that includes the memory cell 200. A CMP or dielectric etchback step then is performed to planarize the dielectric material and remove the dielectric material from the top of the CNT material 212. The diode 204 is then formed over the CNT material 212/reversible resistance-switching element 202.

As stated, the diode 204 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, the diode 204 may be formed from a polycrystalline semiconductor material such as polysilicon, a polycrystalline silicon-germanium alloy, polygermanium or any other suitable material. For example, the diode 204 may include a heavily doped n+ polysilicon region 302, a lightly doped or an intrinsic (unintentionally doped) polysilicon region 304 above the n+ polysilicon region 302 and a heavily doped, p+ polysilicon region 306 above the intrinsic region 304. In some embodiments, a thin germanium and/or silicon-germanium alloy layer (not shown) may be formed on the n+ polysilicon region 302 to prevent and/or reduce dopant migration from the n+ polysilicon region 302 into the intrinsic region 304. Use of such a layer is described, for example, in U.S. patent application Ser. No. 11/298,331, filed Dec. 9, 2005 and titled "DEPOSITED SEMICONDUCTOR STRUCTURE TO MINIMIZE N-TYPE DOPANT DIFFUSION AND METHOD OF MAKING" (hereinafter "the '331 Application"), which is hereby incorporated by reference herein in its entirety for all purposes. In some embodiments, a few hundred angstroms or less of silicon-germanium alloy with about 10 at % or more of germanium may be employed. It will be understood that the locations of the n+ and p+ regions may be reversed.

In some embodiments, a barrier layer 308 such as titanium nitride, tantalum nitride, tungsten nitride, etc., may be formed between the CNT material 212 and the n+ region 302 (e.g., to prevent and/or reduce migration of metal atoms into the polysilicon regions).

Following formation of the diode 204 and barrier layer 308, the diode 204 and barrier layer 308 are etched to form a pillar structure (as shown). Dielectric material 309 is deposited on top of and around the pillar structure so as to isolate the pillar structure from other similar pillar structures of other memory cells (not shown) fabricated on a memory level that includes the memory cell 200. A CMP or dielectric etchback step then is performed to planarize the dielectric material 309 and remove the dielectric material from the top of the diode 204.

When the diode 204 is formed from deposited silicon (e.g., amorphous or polycrystalline), a silicide layer 310 may be formed on the diode 204 to place the deposited silicon in a low resistivity state, as fabricated. Such a low resistivity state allows for easier programming of the memory cell 200 as a large voltage is not required to switch the deposited silicon to a low resistivity state. For example, a silicide-forming metal layer 312 such as titanium or cobalt, may be deposited on the p+ polysilicon region 306. During a subsequent anneal step (described below) employed to crystallize the deposited silicon that forms the diode 204, the silicide-forming metal layer 312 and the deposited silicon of the diode 204 interact to form the silicide layer 310, consuming all or a portion of the silicide-forming metal layer 312.

As described in U.S. Pat. No. 7,176,064, "Memory Cell Comprising a Semiconductor Junction Diode Crystallized Adjacent to a Silicide," which is hereby incorporated by reference herein in its entirety, silicide-forming materials such as titanium and cobalt react with deposited silicon during annealing to form a silicide layer. The lattice spacings of titanium silicide and cobalt silicide are close to that of silicon, and it appears that such silicide layers may serve as "crystallization templates" or "seeds" for adjacent deposited silicon as the deposited silicon crystallizes (e.g., the silicide layer 310 enhances the crystalline structure of the silicon diode 204 during annealing). Lower resistivity silicon thereby is provided. Similar results may be achieved for silicon-germanium alloy and/or germanium diodes.

Following formation of the silicide-forming metal layer 312, the top conductor 208 is formed. In some embodiments, one or more barrier layers and/or adhesion layers 314 may be formed over the silicide-forming metal layer 312 prior to deposition of a conductive layer 315. The conductive layer 315, barrier layer 314 and silicide-forming metal layer 312 may be patterned and/or etched together to form the top conductor 208.

Following formation of the top conductor 208, the memory cell 200 may be annealed to crystallize the deposited semiconductor material of the diode 204 (and/or to form the silicide layer 310). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. As stated, the silicide layer 310 may serve as a "crystallization template" or "seed" during annealing for underlying deposited semiconductor material that forms the diode 204. Lower resistivity diode material thereby is provided.

Figure 3B:
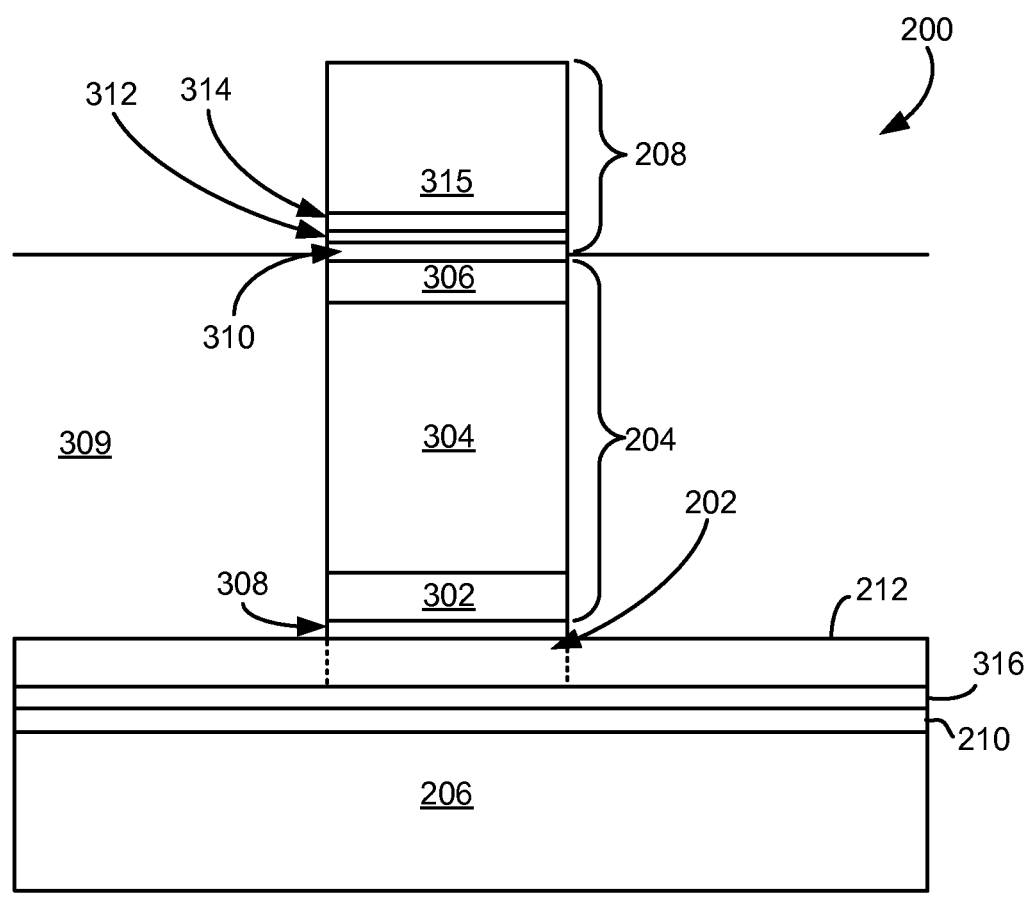
FIG. 3B is a cross-sectional view of a second exemplary embodiment of the memory cell of FIG. 2A.

In some embodiments, the CNT seeding layer 210 may include one or more additional layers. For example, FIG. 3B is a cross-sectional view of a second exemplary embodiment of the memory cell 200 of FIG. 2A in which the CNT seeding layer 210 includes an additional metal catalyst layer 316. The metal catalyst layer 316 may be selectively deposited over the CNT seeding layer 210 after the CNT seeding layer 210 has been patterned, etched and electrically isolated with dielectric material (as described above). For example, in some embodiments, a nickel, cobalt, iron, etc., metal catalyst layer 316 may be selectively formed over a surface roughened titanium or tantalum nitride CNT seeding layer 210 by electroless deposition, electroplating or the like. CNT material 212 then may be formed over the metal catalyst coated CNT seeding layer 210. In some embodiments, use of the metal catalyst layer 316 may eliminate the need for a catalyst precursor during CNT formation. Exemplary metal catalyst layer thicknesses range from about 1 to 200 angstroms, although other thicknesses may be used. A nickel, cobalt, iron, or similar metal catalyst layer also may be formed over a non-surface-roughened or smooth titanium nitride, tanatalum nitride or similar layer by electroless deposition, electroplating or the like.

Figure 3C:
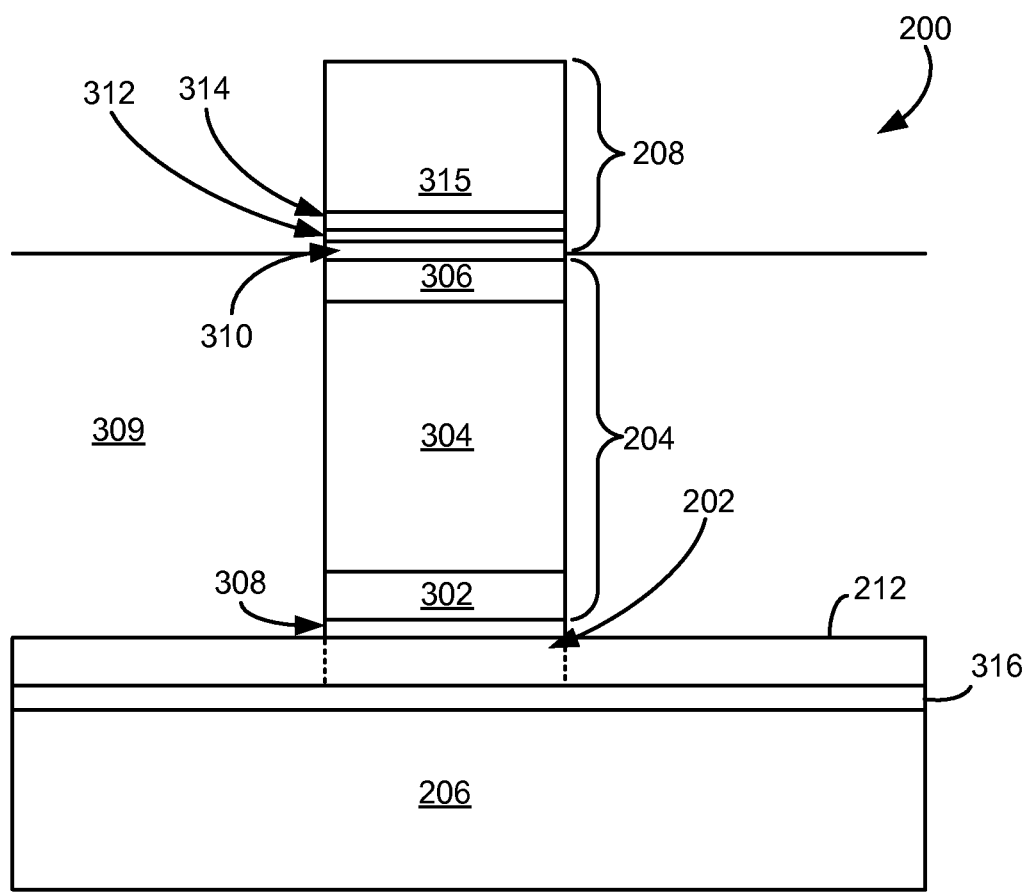
FIG. 3C is a cross-sectional view of a third exemplary embodiment of the memory cell of FIG. 2A.

In another embodiment, only the metal catalyst layer 316 may be used for CNT seeding. For example, FIG. 3C is a cross-sectional view of a third exemplary embodiment of the memory cell 200 of FIG. 2A. The memory cell 200 of FIG. 3C is similar to the memory cell 200 of FIG. 3B, but does not include the surface roughened CNT seeding layer 210. In the embodiment shown, no CNT seeding layer 210 is deposited over the first conductor 206 prior to etching and patterning of the first conductor 206. After the first conductor 206 is patterned and etched, a metal catalyst layer 316 such as nickel, cobalt, iron, etc., may be selectively deposited on the first conductor 206, and CNT material 212 may be formed over the metal catalyst layer 316.

Exemplary Fabrication Process for a Memory Cell

FIGS. 4A-F illustrate cross sectional views of a portion of a substrate 400 during fabrication of a first memory level in accordance with the present invention. As will be described below, the first memory level includes a plurality of memory cells that each includes a reversible resistance-switching element formed by selectively fabricating CNT material above a substrate. Additional memory levels may be fabricated above the first memory level (as described previously with reference to FIGS. 2C-2D).

Figure 4A:
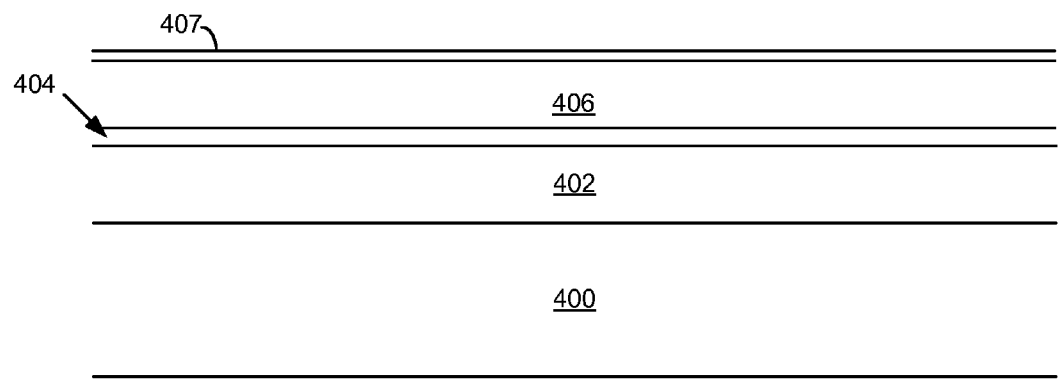
FIGS. 4A-F illustrate cross sectional views of a portion of a substrate during fabrication of a first exemplary memory level in accordance with the present invention.

With reference to FIG. 4A, the substrate 400 is shown as having already undergone several processing steps. The substrate 400 may be any suitable substrate such as a silicon, germanium, silicon-germanium, undoped, doped, bulk, silicon-on-insulator (SOI) or other substrate with or without additional circuitry. For example, the substrate 400 may include one or more n-well or p-well regions (not shown).

Isolation layer 402 is formed above the substrate 400. In some embodiments, the isolation layer 402 may be a layer of silicon dioxide, silicon nitride, silicon oxynitride or any other suitable insulating layer.

Following formation of the isolation layer 402, an adhesion layer 404 is formed over the isolation layer 402 (e.g., by physical vapor deposition or another method). For example, the adhesion layer 404 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, the adhesion layer 404 may be optional.

After formation of the adhesion layer 404, a conductive layer 406 is deposited over the adhesion layer 404. The conductive layer 406 may include any suitable conductive material such as tungsten or another appropriate metal, heavily doped semiconductor material, a conductive silicide, a conductive silicide-germanide, a conductive germanide, or the like deposited by any suitable method (e.g., chemical vapor deposition, physical vapor deposition, etc.). In at least one embodiment, the conductive layer 406 may comprise about 200 to about 2500 angstroms of tungsten. Other conductive layer materials and/or thicknesses may be used.

After formation of the conductive layer 406, a CNT seeding layer 407 is formed over the conductive layer 406. In some embodiments, the CNT seeding layer 407 may be about 1000 to about 5000 angstroms of titanium or tantalum nitride, although other materials and/or thicknesses may be used. In such an embodiment, the surface of the CNT seeding layer 407 may be roughened to allow CNTs to be formed directly on the seeding layer. For example, the CNT seeding layer 407 may be roughened or otherwise textured by a CMP or etchback process. In one or more embodiments, the CNT seeding layer 407 may be roughened so as to have an arithmetic average surface roughness Ra of at least about 850 to 4000 angstroms, and more preferably at least about 4000 angstroms. Other surface roughnesses may be employed.

Figure 4B:
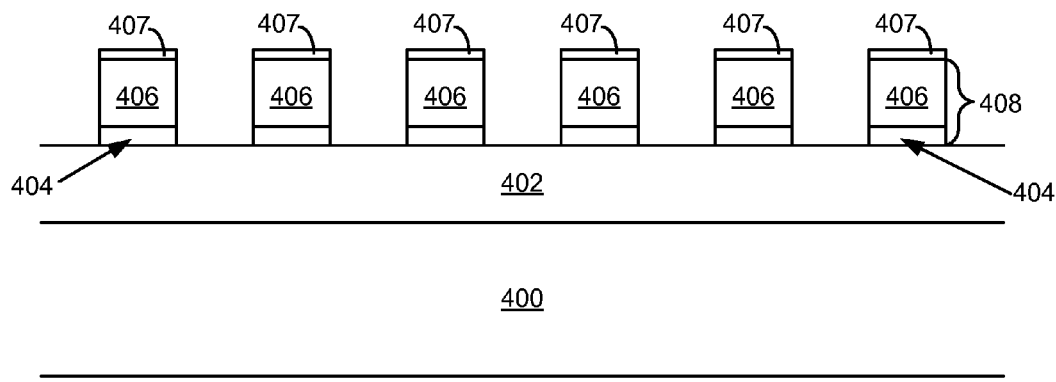

Following formation of the CNT seeding layer 407 and/or CNT seeding layer roughening, the adhesion layer 404, the conductive layer 406 and the CNT seeding layer 407 are patterned and etched as shown in FIG. 4B. For example, the adhesion layer 404, the conductive layer 406 and the CNT seeding layer 407 may be patterned and etched using conventional lithography techniques, with a soft or hard mask, and wet or dry etch processing. In at least one embodiment, the adhesion layer 404, the conductive layer 406 and the CNT seeding layer 407 are patterned and etched so as to form substantially parallel, substantially co-planar conductors 408 (as shown in FIG. 4B). Exemplary widths for the conductors 408 and/or spacings between the conductors 408 range from about 200 to about 2500 angstroms, although other conductor widths and/or spacings may be used.

Figure 4C:
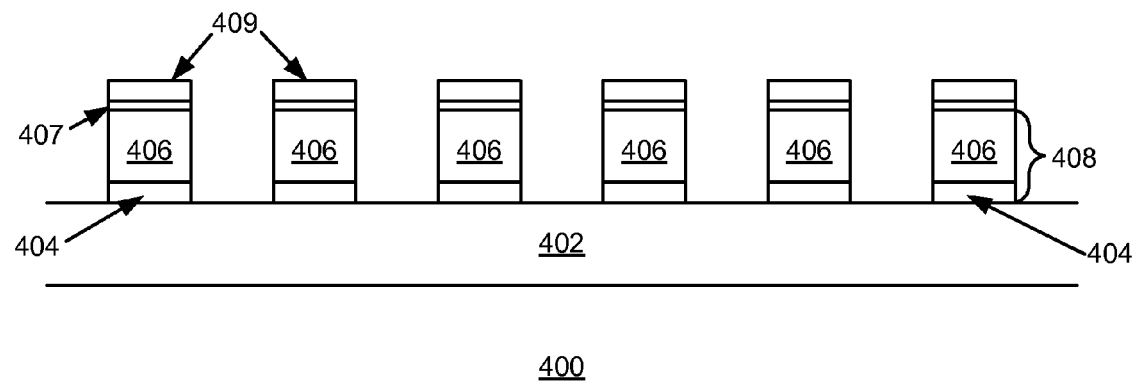
Figure 4D:
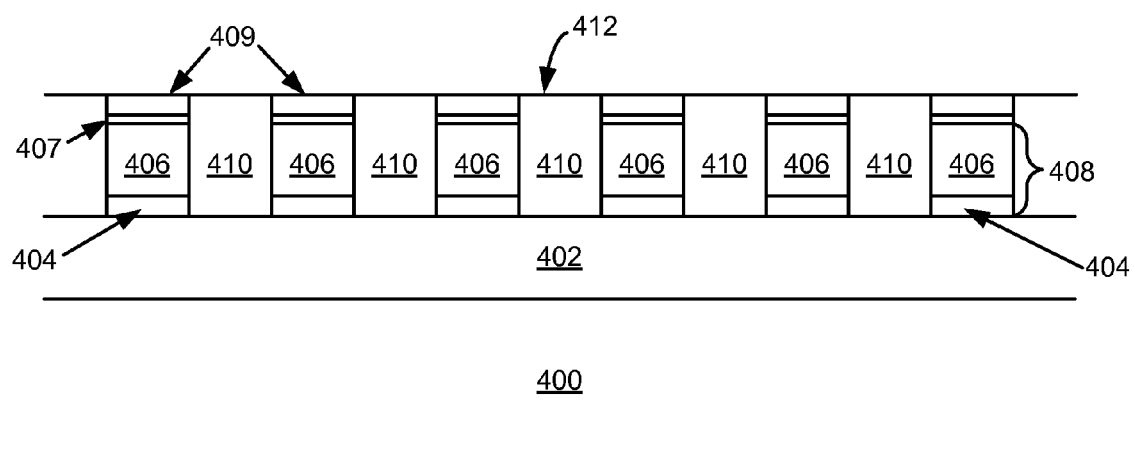

With reference to FIG. 4C, after formation of the bottom conductors 408, CNT material 409 is selectively formed on the CNT seeding layer 407 formed on top of each conductor 408. If the CNT seeding layer 407 is titanium nitride, tantalum nitride or a similar material, the surface of the CNT seeding layer 407 may be roughened to allow CNTs to be formed on the titanium nitride, tantalum nitride or similar CNT seeding layer 407 directly. (See, for example, Smith et al., "Polishing TiN for Nanotube Synthesis", Proceedings of the 16$^{th}$ Annual Meeting of the American Society for Precision Engineering, Nov. 10-15, 2001 and Rao et al., "In situ-grown carbon nanotube array with excellent field emission characteristics", Appl. Phys. Lett., Vol. 76, No. 25, June 19 200, pp. 3813-3815).

In some embodiments, an additional metal catalyst layer (not shown) such as nickel, cobalt, iron, etc., may be selectively deposited over the CNT seeding layer 407 prior to formation of the CNT material 409 to provide the benefits of a metal catalyst during CNT formation (as described previously with reference to FIG. 3B). In other embodiments, a metal catalyst layer may be used without an underlying, surface roughened seeding layer (as described previously with reference to FIG. 3C).

In either case, a CNT fabrication process is performed to selectively grow and/or deposit CNT material 409 on each conductor 408. For each memory cell, at least a portion of the CNT material 409 formed on the memory cell's respective conductor 408 serves as the reversible resistance-switching element 202 of the memory cell. Any suitable method may be used to form CNT material 409 on each conductor 408. For example, CVD, plasma-enhanced CVD, laser vaporization, electric arc discharge or the like may be employed.

In one exemplary embodiment, CNTs may be formed on a TiN seeding layer by CVD at a temperature of about 675 to 700° C. in xylene, argon, hydrogen and/or ferrocene at a flow rate of about 100 sccm for about 30 minutes. Other temperatures, gases, flow rates and/or growth times may be used.

In another exemplary embodiment, CNTs may be formed on a nickel catalyst layer by CVD at a temperature of about 650° C. in about 20% $C_2H_4$ and 80% argon at a pressure of about 5.5 Torr for about 20 minutes. Other temperatures, gases, ratios, pressures and/or growth times may be used.

In yet another embodiment, CNTs may be formed on a metal catalyst layer such as nickel, cobalt, iron, etc., using plasma enhanced CVD at a temperature of about 600 to 900° C. in about 20% methane, ethylene, acetylene or another hydrocarbon diluted with about 80% argon, hydrogen and/or ammonia using an RF power of about 100-200 Watts for about 8-30 minutes. Other temperatures, gases, ratios, powers and/or growth times may be used.

As stated, CNT material 409 forms only over the CNT seeding layer 407 formed on each conductor 408. In some embodiments, the CNT material 409 may have a thickness of about 1 nanometer to about 1 micron (and even tens of microns), and more preferably about 10 to about 20 nanometers, although other CNT material thicknesses may be used. The density of individual tubes in the CNT material 409 may be, for example, about $6.6 \times 10^3$ to about $1 \times 10^6$ CNTs/micron$^2$, and more preferably at least about $6.6 \times 10^4$ CNTs/micron$^2$, although other densities may be used. For example, assuming the conductors 408 have a width of about 45 nanometers, in some embodiments, it is preferred to have at least about 10 CNTs, and more preferably at least about 100 CNTs, in the CNT material 409 formed above each conductor 408 (although fewer CNTs, such as 1, 2, 3, 4, 5, etc., or more CNTs, such as more than 100, may be employed).

After the CNT material 409 has been formed over each conductor 408, a dielectric layer 410 (FIG. 4D) is deposited over the substrate 400 so as to fill the voids between the CNT material regions and conductors 408. In some embodiments, the dielectric layer 410 may be deposited using chemical vapor deposition (CVD), high density plasma (HDP) deposition, arc plasma assisted deposition, spin-coating deposition or the like. For example, approximately a micron or more of silicon dioxide may be deposited on the substrate 400 and planarized using chemical mechanical polishing or an etch-back process to form a planar surface 412. The planar surface 412 includes exposed, discrete regions of CNT material 409 separated by dielectric material 410, as shown.

Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Figure 4E:
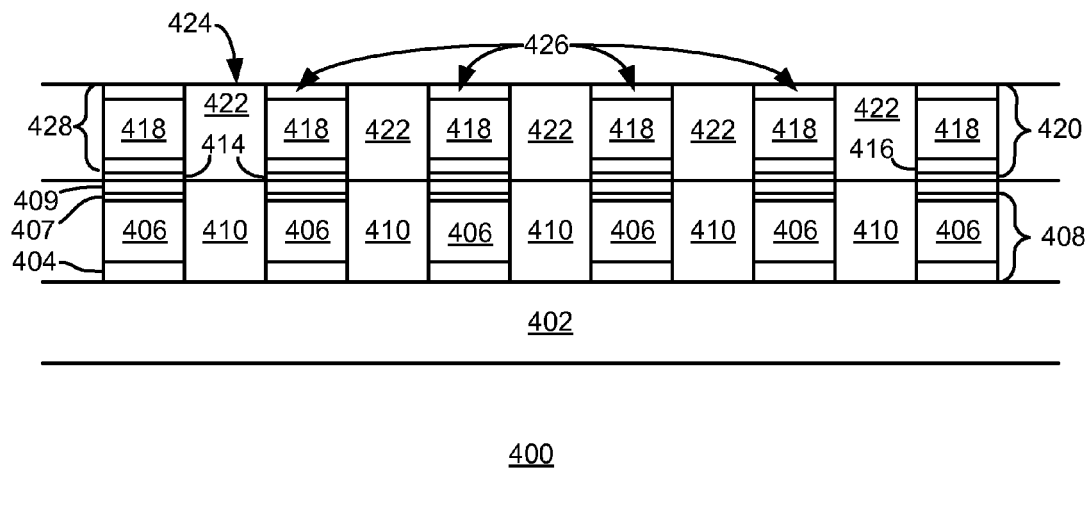

With reference to FIG. 4E, after planarization and exposure of the top surface of the CNT material regions, the diode structures of each memory cell are formed. In some embodiments, a barrier layer 414, such as titanium nitride, tantalum nitride, tungsten nitride, etc., may be formed over the CNT material regions 409 prior to diode formation (e.g., to prevent and/or reduce migration of metal atoms into the polysilicon regions). The barrier layer 414 may be about 20 to about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of the barrier layer 414, deposition of the semiconductor material used to form the diode of each memory cell begins (e.g., diode 204 in FIGS. 2A-3C). Each diode may be a vertical p-n or p-i-n diode as previously described. In some embodiments, each diode is formed from a polycrystalline semiconductor material such as polysilicon, a polysilicon-germanium alloy, germanium or any other suitable material. For convenience, formation of a polysilicon, downward-pointing diode is described herein. It will be understood that other materials and/or diode configurations may be used.

With reference to FIG. 4E, following formation of the barrier layer 414, a heavily doped n+ silicon layer 416 is deposited on the barrier layer 414. In some embodiments, the n+ silicon layer 416 is in an amorphous state as deposited. In other embodiments, the n+ silicon layer 416 is in a polycrystalline state as deposited. Chemical vapor deposition or another suitable process may be employed to deposit the n+ silicon layer 416. In at least one embodiment, the n+ silicon layer 416 may be formed, for example, from about 100 to about 1000 angstroms, preferably about 100 angstroms, of phosphorus or arsenic doped silicon having a doping concentration of about $10^{21}$ cm$^{-3}$. Other layer thicknesses, dopants and/or doping concentrations may be used. The n+ silicon layer 416 may be doped in situ, for example, by flowing a donor gas during deposition. Other doping methods may be used (e.g., implantation).

After deposition of the n+ silicon layer 416, a lightly doped, intrinsic and/or unintentionally doped silicon layer 418 is formed over the n+ silicon layer 416. In some embodiments, the intrinsic silicon layer 418 is in an amorphous state as deposited. In other embodiments, the intrinsic silicon layer 418 is in a polycrystalline state as deposited. Chemical vapor deposition or another suitable deposition method may be employed to deposit the intrinsic silicon layer 418. In at least one embodiment, the intrinsic silicon layer 418 may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on the n+ silicon layer 416 prior to deposition of the intrinsic silicon layer 418 to prevent and/or reduce dopant migration from the n+ silicon layer 416 into the intrinsic silicon layer 418 (as described in the '331 Application, previously incorporated).

Following formation of the n+ silicon layer 416 and the intrinsic silicon layer 418, the n+ silicon layer 416, the intrinsic silicon layer 418, and the barrier layer 414 are patterned and etched so as to form silicon pillars 420 overlying the conductors 408 (as shown). Conventional lithography techniques, with a soft or hard mask, and wet or dry etch processing may be employed to form the silicon pillars 420.

After the silicon pillars 420 have been formed, a dielectric layer 422 is deposited to fill the voids between the silicon pillars 420. For example, approximately 200-7000 angstroms of silicon dioxide may be deposited and planarized using chemical mechanical polishing or an etchback process to form a planar surface 424. The planar surface 424 includes exposed top surfaces of the silicon pillars 420 separated by dielectric material 422, as shown. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

After formation of the silicon pillars 420, a p+ silicon region 426 is formed within each silicon pillar 420, near the upper surface of the silicon pillars 420. For example, a blanket p+ implant may be employed to implant boron a predetermined depth within the silicon pillars 420. Exemplary implantable molecular ions include $BF_2$, $BF_3$, B and the like. In some embodiments, an implant dose of about $1\text{-}5 \times 10^{15}$ ions/cm$^2$ may be employed. Other implant species and/or doses may be used. Further, in some embodiments, a diffusion process may be employed to dope the upper portion of the silicon pillars 420. In at least one embodiment, the p+ silicon regions 426 have a depth of about 100-700 angstroms, although other p+ silicon region sizes may be used. (Note that if the diodes to be formed are upward pointing p-n or p-i-n diodes, the upper portion of the silicon pillars 420 will be doped n-type). Each silicon pillar 420 thereby includes a downward-pointing, p-i-n diode 428.

Figure 4F:
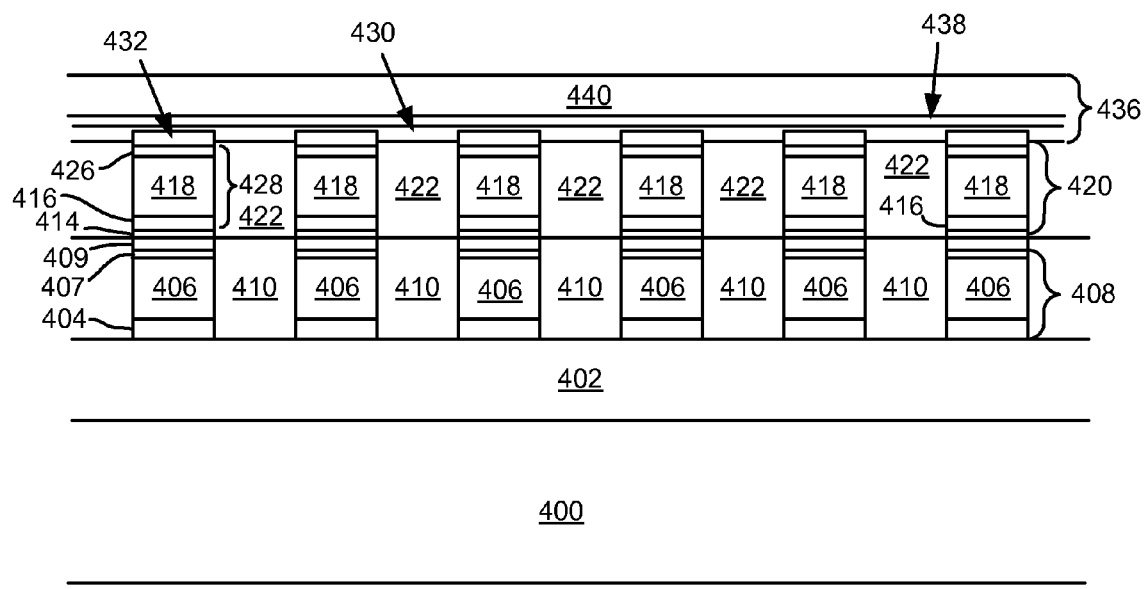

With reference to FIG. 4F, after completion of the p-i-n diodes 428, a silicide-forming metal layer 430 is deposited over the substrate 400. Exemplary silicide-forming metals include sputter or otherwise deposited titanium or cobalt. In some embodiments, the silicide-forming metal layer 430 has a thickness of about 10 to about 200 angstroms, preferably about 20 to about 50 angstroms and more preferably about 20 angstroms. Other silicide-forming metal layer materials and/or thicknesses may be used. As will be described further below, annealing of the structure causes metal from the silicide-forming metal layer 430 and silicon from the p+ silicon regions 426 to react to form a silicide region 432 adjacent each p+ silicon region 426.

Following formation of the silicide-forming metal layer 430, a second set of conductors 436 may be formed above the diodes 428 in a manner similar to the formation of the bottom set of conductors 408. In some embodiments, one or more barrier layers and/or adhesion layers 438 may be placed over the silicide-forming metal layer 430 prior to deposition of a conductive layer 440 used to form the upper, second set of conductors 436.

The conductive layer 440 may be formed from any suitable conductive material such as tungsten, another suitable metal, heavily doped semiconductor material, a conductive silicide, a conductive silicide-germanide, a conductive germanide, or the like deposited by any suitable method (e.g., chemical vapor deposition, physical vapor deposition, etc.). Other conductive layer materials may be used. Barrier layers and/or adhesion layers 438 may include titanium nitride or another suitable layer such as tantalum nitride, tungsten nitride, combinations of one or more layers, or any other suitable material(s). The deposited conductive layer 440, barrier and/or adhesion layer 438, and/or silicide-forming metal layer 430 may be patterned and etched to form the second set of conductors 436. In at least one embodiment, the upper conductors 436 are substantially parallel, substantially coplanar conductors that extend in a different direction than the lower conductors 408.

In other embodiments of the invention, the upper conductors 436 may be formed using a damascene process in which a dielectric layer is formed, patterned and etched to create openings or voids for the conductors 436. The openings or voids may be filled with the adhesion layer 438 and the conductive layer 440 (and/or a conductive seed, conductive fill and/or barrier layer if needed). The adhesion layer 438 and conductive layer 440 then may be planarized to form a planar surface.

In at least one embodiment of the invention, a hard mask may be formed over the diodes 428 as described, for example, in U.S. patent application Ser. No. 11/444,936, filed May 13, 2006 and titled "CONDUCTIVE HARD MASK TO PROTECT PATTERNED FEATURES DURING TRENCH ETCH" (hereinafter "the '936 Application") which is hereby incorporated by reference herein in its entirety. For example, prior to patterning and etching of the intrinsic silicon layer 418 and n+ silicon layer 416, a p+ silicon layer may be formed by doping the intrinsic layer 418 (e.g., using ion implantation or another doping method). The silicide-forming metal layer 430 may be formed over the p+ silicon layer, followed by a barrier layer and/or conductive layer. These barrier and conductive layers may serve as a hard mask during patterning and etching of the diodes 428 and may mitigate any overetching that may occur during formation of the top conductors 436 (as described in the '936 Application).

Following formation of the upper conductors 436, the structure may be annealed to crystallize the deposited semiconductor material of the diodes 428 (and/or to form the silicide regions 432). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. The silicide regions 432 may serve as "crystallization templates" or "seeds" during annealing for underlying deposited semiconductor material that forms the diodes 428 (e.g., changing any amorphous semiconductor material to polycrystalline semiconductor material and/or improving overall crystalline properties of the diodes 428). Lower resistivity diode material thereby is provided.

Alternative Exemplary Memory Cell

Figure 5A:
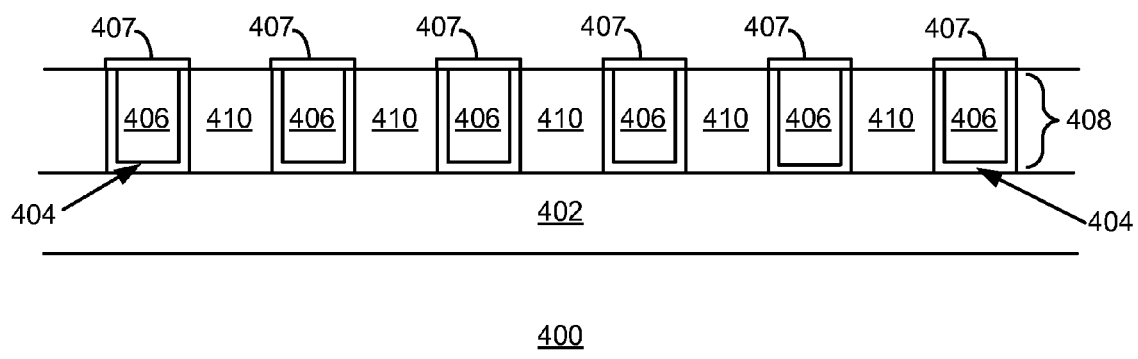
FIGS. 5A-C illustrate cross sectional views of a portion of a substrate during fabrication of a second exemplary memory level provided in accordance with the present invention.

In other embodiments of the invention, the bottom conductors 408 may be formed using a damascene process as described below with reference to FIGS. 5A-C. Referring to FIG. 5A, the dielectric layer 410 is formed, patterned and etched to create openings or voids for the conductors 408. The openings or voids then may be filled with the adhesion layer 404 and the conductive layer 406 (and/or a conductive seed, conductive fill and/or barrier layer if needed). The adhesion layer 404 and conductive layer 406 then may be planarized to form a planar surface (as shown). In such an embodiment, the adhesion layer 404 lines the bottom and sidewalls of each opening or void.

Following planarization, the CNT seeding layer 407 is formed over the bottom conductors 408. In at least one embodiment, a selective deposition process may be used to form a metal catalyst CNT seeding layer 407 over each bottom conductor 408. Exemplary metal catalyst seeding layers include nickel, cobalt, iron, etc., which may be selectively deposited by electroless deposition, electroplating or the like. Alternatively, a titanium nitride, tantalum nitride or similar CNT seeding layer may be deposited over the bottom conductors 408, surface roughened, patterned and etched to form a CNT seeding layer region 407 over each conductor 408 (with or without an additional metal catalyst layer such as nickel, cobalt, iron, etc.). A nickel, cobalt, iron, or similar metal catalyst layer also may be formed over a non-surface-roughened or smooth titanium nitride, tanatalum nitride or similar layer by electroless deposition, electroplating or the like.

Figure 5B:
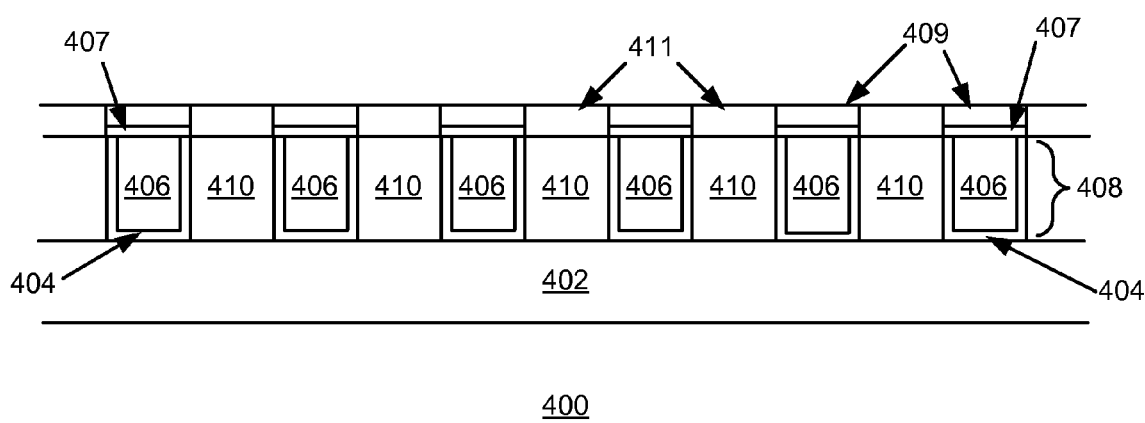
Figure 5C:
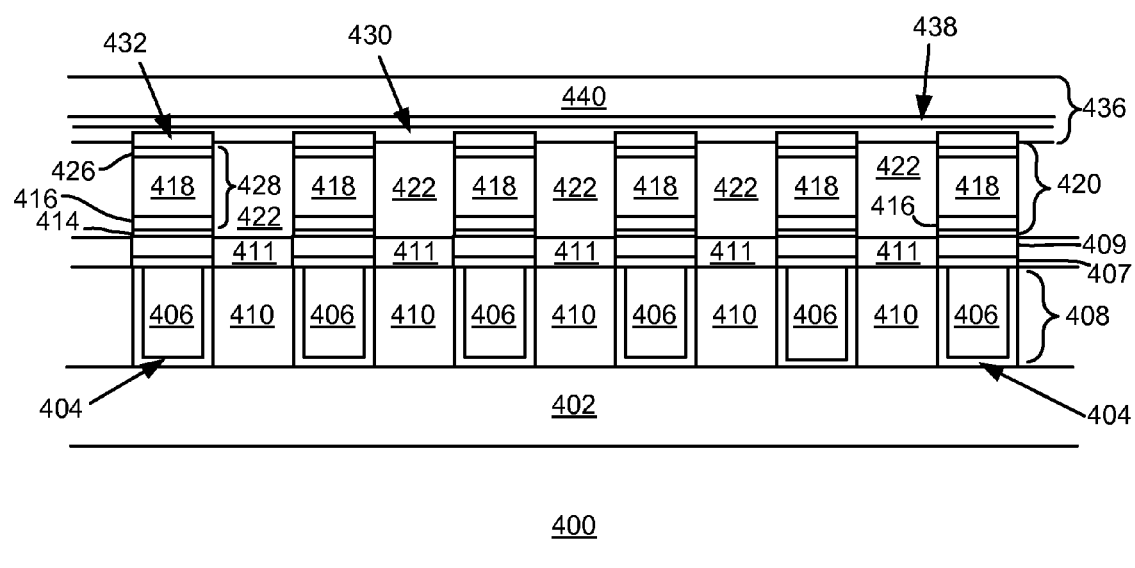

Referring to FIG. 5B, following formation of the CNT seeding layer regions 407, CNT material 409 is selectively formed over each CNT seeding layer region. Any suitable method may be used to form CNT material 409 over each conductor 408. For example, CVD, plasma-enhanced CVD, laser vaporization, electric arc discharge or the like may be employed.

Vertically aligned CNTs allow vertical current flow with little or no lateral conduction. To reduce or prevent the formation of lateral or bridging conduction paths between adjacent memory cells, in some embodiments, the individual tubes of the CNT material 409 may be fabricated so as to be substantially vertically aligned (e.g., thereby reducing and/or preventing the state of a memory cell from being influenced or "disturbed" by the state and/or programming of adjacent memory cells). Note that individual tube isolation may or may not extend over the entire thickness of the CNT material 409. For example, during the initial growth phase, some or most of the individual tubes may be vertical aligned (e.g., not touching). However, as the individual tubes increase in length vertically, portions of the tubes may come in contact with one another, and even become entangled or entwined.

Following formation of the CNT material 409 over each bottom conductor 408, dielectric material 411 is deposited on top of and around the regions of CNT material 409 so as to isolate adjacent CNT material regions from one another. In some embodiments, the dielectric material 411 may be deposited using chemical vapor deposition (CVD), high density plasma (HDP) deposition, arc plasma assisted deposition, spin-coating deposition or the like. A CMP or dielectric etchback step then is performed to planarize the dielectric material 411 and remove the dielectric material from the top of the CNT material regions. For example, approximately 200-7000 angstroms, and in some embodiments a micron or more, of silicon dioxide may be deposited and planarized using chemical mechanical polishing or an etchback process. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Once the dielectric layer has been planarized and the top surface of the CNT material regions exposed, formation of the memory level proceeds as previously described with reference to FIGS. 4E-4F, resulting in the memory level shown in FIG. 5C.

As stated previously, deposited or grown CNT material typically has a rough surface topography, with pronounced thickness variations, such as numerous peaks and valleys. These thickness variations make CNT materials difficult to etch without excessive etching of the underlying substrate, increasing fabrication costs and complexity associated with their use in integrated circuits. In one or more of the previously described embodiments, selective formation of CNT material on a CNT seeding layer may be used to eliminate or minimize the need to etch CNT material. In accordance with one or more other embodiments of the invention, a dielectric fill and planarization process may be used to smooth out many of the thickness variations in a CNT material layer, allowing the CNT material layer to be more easily etched, and reducing fabrication costs and complexity.

The foregoing description discloses only exemplary embodiments of the invention. Modifications of the above disclosed apparatus and methods which fall within the scope of the invention will be readily apparent to those of ordinary skill in the art.

Accordingly, while the present invention has been disclosed in connection with exemplary embodiments thereof, it should be understood that other embodiments may fall within the spirit and scope of the invention, as defined by the following claims.

The invention claimed is:

1. A method of fabricating a memory cell, the method comprising:
   fabricating a first conductor above a substrate;
   selectively fabricating a reversible resistance-switching carbon nano-tube (CNT) material above the first conductor;
   fabricating a diode in series with the CNT material; and
   fabricating a second conductor above the diode.

2. The method of claim 1 wherein fabricating the CNT material includes:
   fabricating a CNT seeding layer on the first conductor; and
   selectively fabricating CNT material on the CNT seeding layer.

3. The method of claim 2 wherein fabricating the CNT seeding layer includes:
   depositing titanium nitride above the first conductor; and
   roughening a surface of the deposited titanium nitride.

4. The method of claim 3 further comprising selectively depositing a metal layer on the roughened titanium nitride surface.

5. The method of claim 4 wherein the metal layer comprises nickel, cobalt or iron.

6. The method of claim 2 wherein fabricating the CNT seeding layer includes:
   depositing titanium nitride above the first conductor; and
   selectively depositing a metal catalyst layer on the titanium nitride.

7. The method of claim 6 wherein the metal catalyst layer comprises nickel, cobalt or iron.

8. The method of claim 2 further comprising patterning and etching the CNT seeding layer.

9. The method of claim 8 wherein patterning and etching the CNT seeding layer includes patterning and etching the first conductor.

10. The method of claim 1 wherein fabricating the CNT material includes:
    selectively depositing a metal layer above the first conductor; and
    selectively fabricating CNT material on the deposited metal layer.

11. The method of claim 10 wherein the metal layer comprises nickel, cobalt or iron.

12. The method of claim 1 wherein fabricating the diode comprises fabricating a vertical polycrystalline diode.

13. The method of claim 12 further comprising fabricating a silicide, silicide-germanide or germanide region in contact with polycrystalline material of the vertical polycrystalline diode so that the polycrystalline material is in a low-resistivity state.

14. The method of claim 12 wherein the diode is a p-n or p-i-n diode.

15. The method of claim 1 further comprising creating defects in the CNT material so as to tune switching characteristics of the CNT material.

16. The method of claim 1 wherein selectively fabricating the CNT material includes fabricating CNT material having CNTs that are substantially vertically aligned so as to reduce lateral conduction in the CNT material.

17. A memory cell formed using the method of claim 1.

18. A memory cell formed using the method of claim 11.

19. A method of fabricating a memory cell, the method comprising:
    fabricating a first conductor above a substrate;
    fabricating a reversible resistance-switching carbon nano-tube (CNT) material above the first conductor;
    fabricating a vertical polycrystalline diode in series with the reversible resistance-switching CNT material; and
    fabricating a second conductor above the vertical polycrystalline diode.

20. The method of claim 19 wherein fabricating the reversible-resistance switching CNT material includes:
    fabricating a CNT seeding layer; and
    selectively fabricating CNT material on the CNT seeding layer.

21. The method of claim 20 wherein fabricating the CNT seeding layer includes:
    depositing titanium nitride on the first conductor; and
    roughening a surface of the deposited titanium nitride.

22. The method of claim 21 further comprising selectively depositing a metal layer on the roughened titanium nitride surface.

23. The method of claim 20 further comprising patterning and etching the CNT seeding layer during patterning and etching of the first conductor.

24. The method of claim 19 wherein fabricating the reversible-resistance switching CNT material includes:
    selectively depositing a metal layer on the first conductor; and
    selectively fabricating CNT material on the deposited metal layer.

25. The method of claim 19 further comprising fabricating a silicide, silicide-germanide or germanide region in contact with polycrystalline material of the vertical polycrystalline diode so that the polycrystalline material is in a low-resistivity state.

26. A memory cell formed using the method of claim 19.

27. A memory cell comprising:
a first conductor;
a reversible resistance-switching carbon nano-tube (CNT) material selectively fabricated above the first conductor;
a diode formed in series with the reversible resistance-switching CNT material; and
a second conductor formed above the diode.

28. The memory cell of claim 27 wherein the CNT material includes CNTs that are substantially vertically aligned so as to reduce lateral conduction in the CNT material.

29. The memory cell of claim 27 wherein the CNT material includes defects that tune the switching characteristics of the CNT material.

30. The memory cell of claim 27 wherein the diode comprises a vertical polycrystalline diode.

31. The memory cell of claim 30 further comprising a silicide, silicide-germanide or germanide region in contact with polycrystalline material of the vertical polycrystalline diode so that the polycrystalline material is in a low-resistivity state.

32. The memory cell of claim 27 further comprising a CNT seeding layer formed on the first conductor and on which the CNT material is selectively fabricated.

33. The memory cell of claim 32 wherein the CNT seeding layer comprises a conducting layer.

34. The memory cell of claim 33 wherein the conducting layer comprises titanium nitride.

35. The memory cell of claim 34 wherein the titanium nitride is surface roughened.

36. The memory cell of claim 33 wherein the conducting layer comprises nickel, cobalt or iron.

37. A plurality of nonvolatile memory cells comprising:
a first plurality of substantially parallel, substantially coplanar conductors extending in a first direction;
a plurality of diodes;
a plurality of reversible resistance-switching elements; and
a second plurality of substantially parallel, substantially coplanar conductors extending in a second direction different from the first direction;
wherein, in each memory cell, one of the diodes is formed in series with one of the reversible resistance-switching elements, disposed between one of the first conductors and one of the second conductors; and
wherein each reversible resistance-switching element includes selectively fabricated reversible resistance-switching carbon nano-tube (CNT) material formed above one of the first conductors.

38. The plurality of memory cells of claim 37 wherein the CNT material includes CNTs that are substantially vertically aligned so as to reduce lateral conduction in the CNT material.

39. The plurality of memory cells of claim 37 further comprising a CNT material layer that extends between two or more of the memory cells and forms the reversible resistance-switching element of the two or more memory cells.

40. The plurality of memory cells of claim 37 wherein each diode is a vertical polycrystalline diode.

41. The plurality of memory cells of claim 40 further comprising silicide, silicide-germanide or germanide in contact with polycrystalline material of each vertical polycrystalline diode so that the polycrystalline material is in a low-resistivity state.

42. The plurality of memory cells of claim 37 further comprising a CNT seeding layer that extends between two or more of the memory cells and on which CNT material is selectively formed.

43. The plurality of memory cells of claim 42 wherein the CNT seeding layer comprises a conducting layer.

44. The plurality of memory cells of claim 43 wherein the conducting layer comprises titanium nitride.

45. The plurality of memory cells of claim 44 wherein the titanium nitride is surface roughened.

46. A monolithic three dimensional memory array comprising:
a first memory level formed above a substrate, the first memory level comprising:
a plurality of memory cells, wherein each memory cell of the first memory level comprises:
a first conductor;
a reversible resistance-switching carbon nano-tube (CNT) material selectively fabricated above the first conductor;
a diode formed in series with the reversible resistance-switching CNT material; and
a second conductor formed above the diode; and
at least a second memory level monolithically formed above the first memory level.

47. The monolithic three dimensional memory array of claim 46 wherein the CNT material of each reversible resistance-switching CNT material includes CNTs that are substantially vertically aligned so as to reduce lateral conduction in the CNT material.

48. The monolithic three dimensional memory array of claim 46 further comprising a CNT material layer that extends between two or more of the memory cells and forms the reversible resistance-switching CNT material of the two or more memory cells.

49. The monolithic three dimensional memory array of claim 46 wherein each diode comprises a vertical polycrystalline diode.

50. The monolithic three dimensional memory array of claim 49 wherein each vertical polycrystalline diode comprises a vertical polysilicon diode.

51. The monolithic three dimensional memory array of claim 46 wherein the first memory level further comprises a CNT seeding layer that extends between two or more of the memory cells and on which CNT material is selectively formed.

* * * * *